United States Patent
Yamauchi et al.

(10) Patent No.: US 11,335,573 B2
(45) Date of Patent: May 17, 2022

(54) DRY ETCHING METHOD AND β-DIKETONE-FILLED CONTAINER

(71) Applicant: Central Glass Company, Limited, Ube (JP)

(72) Inventors: Kunihiro Yamauchi, Ube (JP); Takashi Masuda, Ube (JP); Akifumi Yao, Ube (JP)

(73) Assignee: Cental Glass Company, Limited, Ube (JP)

(*) Notice: Subject to any disclaimer, the term of this patent is extended or adjusted under 35 U.S.C. 154(b) by 0 days.

(21) Appl. No.: 16/461,448

(22) PCT Filed: Dec. 20, 2017

(86) PCT No.: PCT/JP2017/045709
§ 371 (c)(1),
(2) Date: May 16, 2019

(87) PCT Pub. No.: WO2018/128079
PCT Pub. Date: Jul. 12, 2018

(65) Prior Publication Data
US 2019/0348307 A1    Nov. 14, 2019

(30) Foreign Application Priority Data

Jan. 4, 2017  (JP) .............................. JP2017-000143

(51) Int. Cl.
*H01L 21/67*        (2006.01)
*C23F 1/12*         (2006.01)
(Continued)

(52) U.S. Cl.
CPC .......... *H01L 21/67069* (2013.01); *C23F 1/12* (2013.01); *C23F 4/02* (2013.01); *H01L 21/302* (2013.01); *H01L 21/32135* (2013.01)

(58) Field of Classification Search
None
See application file for complete search history.

(56) References Cited

U.S. PATENT DOCUMENTS 6,284,146 B1 *  9/2001  Kim .................... C23F 4/00
                                                     216/13
2004/0242012 A1   12/2004  Ikeda
(Continued)

FOREIGN PATENT DOCUMENTS

CN    101386572    *  3/2009
JP    8-153708 A       6/1996
(Continued)

OTHER PUBLICATIONS

International Search Report (PCT/ISA/210) issued in PCT Application No. PCT/JP2017/045709 dated Jan. 30, 2018 with English translation (five (5) pages).
(Continued)

*Primary Examiner* — Stephanie P Duclair
(74) *Attorney, Agent, or Firm* — Crowell & Moring LLP

(57) ABSTRACT

Disclosed is a dry etching method for etching a metal film on a substrate with an etching gas containing a β-diketone and an additive gas, wherein the metal film contains a metal element capable of forming a complex with the β-diketone; and wherein the amount of water contained in the etching gas is 30 mass ppm or less relative to the amount of the β-diketone. It is preferable that the β-diketone used for the dry etching method is supplied from a β-diketone filled container, wherein the β-diketone filled container has a sealed container body filled with a β-diketone whose water content is 15 mass ppm or less relative to the β-diketone. This etching method enables etching of the metal film while suppressing etching rate variations from the initial stage to the later stage of use of the filled container.

8 Claims, 2 Drawing Sheets

(51) Int. Cl.
*C23F 4/02* (2006.01)
*H01L 21/302* (2006.01)
*H01L 21/3213* (2006.01)

(56) References Cited

U.S. PATENT DOCUMENTS

| | | | |
|---|---|---|---|
| 2007/0000870 A1 | 1/2007 | Ikeda | |
| 2010/0099264 A1* | 4/2010 | Elers | H01L 21/31122 |
| | | | 438/710 |
| 2012/0180811 A1 | 7/2012 | Gunji et al. | |
| 2014/0352716 A1* | 12/2014 | Kikuchi | H01L 21/67034 |
| | | | 134/2 |
| 2015/0047680 A1 | 2/2015 | Umezaki et al. | |
| 2015/0099369 A1 | 4/2015 | Deshmukh et al. | |
| 2015/0270140 A1 | 9/2015 | Gupta et al. | |
| 2017/0032990 A1 | 2/2017 | Lin et al. | |

FOREIGN PATENT DOCUMENTS

| | | |
|---|---|---|
| JP | 2003-86569 A | 3/2003 |
| JP | 2004-91829 A | 3/2004 |
| JP | 2005-101361 A | 4/2005 |
| JP | 2013-194307 A | 9/2013 |
| JP | 2014-236096 A | 12/2014 |
| KR | 10-2012-0083867 A | 7/2012 |
| KR | 10-2014-0141531 A | 2/2014 |
| KR | 10-2014-0124858 A | 10/2014 |
| TW | 201343907 A | 11/2013 |
| TW | 201445634 A | 12/2014 |

OTHER PUBLICATIONS

Japanese-language Written Opinion (PCT/ISA/237) issued in PCT Application No. PCT/JP2017/045709 dated Jan. 30, 2018 (four (4) pages).
Taiwanese-language Office Action issued in counterpart Taiwanese Application No. 107100152 dated Dec. 7, 2018 (eight (8) pages).
U.S. Office Action issued in U.S. Appl. No. 16/461,600 dated Feb. 19, 2020 (11 pages).
International Search Report (PCT/ISA/210) issued in PCT Application No. PCT/JP2017/045708 dated Feb. 13, 2018 with English translation (seven (7) pages).
Japanese-language Written Opinion (PCT/ISA/237) issued in PCT Application No. PCT/JP2017/045708 dated Feb. 13, 2018 (four (4) pages).
Jain A et al., "Thermal Dry-Etching of Copper Using Hydrogen Peroxide and Hexafluoroacety Lacetone", Thin Solid Films Elsevier Advanced Technology, Nov. 15, 1995, pp. 51-56, vol. 296, No. 1, (six (6) pages).
Chinese-language Office Action issued in counterpart Taiwanese Application No. 107100151 dated Dec. 7, 2018 (nine (9) pages).
Korean-language Office Action issued in Korean Application No. 10-2019-7022865 dated Nov. 29, 2020 with English translation (17 pages).
Korean-language Office Action issued in Korean Application No. 10-2019-7022860 dated Nov. 29, 2020 with English translation (17pages).

\* cited by examiner

DRY ETCHING METHOD AND β-DIKETONE-FILLED CONTAINER

FIELD OF THE INVENTION

The present invention relates to a technique for etching a metal film with an etching gas containing a β-diketone and to a β-diketone filled container used therefor.

BACKGROUND ART

The manufacturing process of semiconductor devices sometimes includes etching metal films formed on substrates to be used as wiring materials, metal gate materials, electrode materials or magnetic materials.

With the fine processing of semiconductor devices, there has been a demand to highly control the etching of metal films for the purpose of etching the metal films into a fine structures. More specifically, researches have been made to etch the metal film with etching depth variations of 1 nm or less in the wafer plane, to control the surface roughness of the metal film after the etching, to selectively etch the metal film, and the like. It is however difficult to perform such high etching control by a wet etching method in which a metal film is etched with a chemical solution. A dry etching method in which a metal film is etched with a gas is being studied for high etching control.

For example, Patent Document 1 discloses an etching method which includes an etching step of etching a thin film on a substrate with an etching gas containing a β-diketone, thereby exposing a surface of the substrate. Patent Document 2 discloses an etching method for etching a metal film with an etching gas containing a β-diketone and 1 to 20 vol % of water or hydrogen peroxide. In Patent Document 2, zinc, cobalt, hafnium, iron, manganese, vanadium and the like are described as examples of the metal element of the metal film. It is reported in Patent Document 2 that the etching rate of the metal film becomes higher with the addition of water or hydrogen peroxide than with the use of oxygen.

Further, Patent Document 3 discloses a selective etching method of a laminated insulating film, in which a silicon oxide film layer of the laminated insulating film is selectively etched by supplying into an etching chamber a $CHF_3$ gas from a gas cylinder and a carbonyl-containing gas vaporized from a liquid material such as methyl ethyl ketone filled in a liquid material container.

The use of β-diketones has also been proposed, not for fine etching of metal films formed on substrates, but for dry cleaning of metal films deposited in film-forming apparatuses in semiconductor manufacturing process.

For example, Patent Document 4 discloses a dry cleaning method for removing a metal film deposited in a film-forming apparatus by reacting the metal film with a cleaning gas containing a β-diketone and NOx (either one of NO and $N_2O$) in a temperature range of 200 to 400° C. In Patent Document 4, nickel, manganese, iron, cobalt and the like are disclosed as examples of the constituent metal of the metal film in Patent Document 3. It is reported in Patent Document 4 that the temperature range in which the metal film can be etched and removed becomes wider with the use of NOx than with the use of oxygen.

PRIOR ART DOCUMENTS

Patent Documents

Patent Document 1: Japanese Laid-Open Patent Publication No. 2004-91829

Patent Document 2: Japanese Laid-Open Patent Publication No. 2014-236096

Patent Document 3: Japanese Laid-Open Patent Publication No. H08-153708

Patent Document 4: Japanese Laid-Open Patent Publication No. 2013-194307

SUMMARY OF THE INVENTION

Problems to be Solved by the Invention

It has however been found as a result of researches made by the present inventors that, in the case of supplying a β-diketone in gaseous form from a filled container into a treatment chamber of an etching device and etching a metal film with a mixture of the β-diketone gas and an additive gas, excessive etching of the metal film can unexpectedly occur. In particular, there is a problem that, when the filled container, in which the β-diketone is filled in liquid form and from which the β-diketone is supplied in gaseous form to the etching device, is exchanged with a new one, the etching rate of the metal film differs at the initial stage and later stage of use of the filled container.

The present invention has been made in view of the above circumstances. It is an object of the present invention to provide a method for etching a metal film while suppressing etching rate variations from the initial stage to the later stage of use of a filled container and to provide a β-diketone filled container for realizing such etching of the metal film.

Means for Solving the Problems

The present inventors have found that: the etching rate of the metal film is largely influenced by a slight amount of water contained in the etching gas; and, when the amount of entrained water in a liquid β-diketone filled into a sealed container is controlled to a predetermined value or less, the amount of water in a gas of the β-diketone supplied from the filled container is controlled to a predetermined value or less whereby variations in the etching rate of the metal film are suppressed irrespective of the amount of the β-diketone remaining in the filled container. The present invention is based on these findings.

According to one aspect of the present invention, there is provided a dry etching method comprising etching a metal film on a substrate with an etching gas containing a β-diketone and an additive gas, wherein the metal film contains a metal capable of forming a complex with the β-diketone; and wherein the amount of water contained in the etching gas is 30 mass ppm or less relative to the amount of the β-diketone.

According to another aspect of the present invention, there is provided a β-diketone filled container used for dry etching of a metal film on a substrate with an etching gas containing a β-diketone and an additive gas, comprising a sealed container body filled with a purified β-diketone, wherein the amount of water contained in the sealed container body is 15 mass ppm or less relative to the amount of the β-diketone.

It is possible by the etching method according to the present invention to etch the metal film while suppressing etching rate variations from the initial stage to the later stage of use of a filled container. It is also possible to realize such etching of the metal film with the use of the β-diketone filled container according to the present invention.

DETAILED DESCRIPTION OF THE EMBODIMENTS

Figure 1:
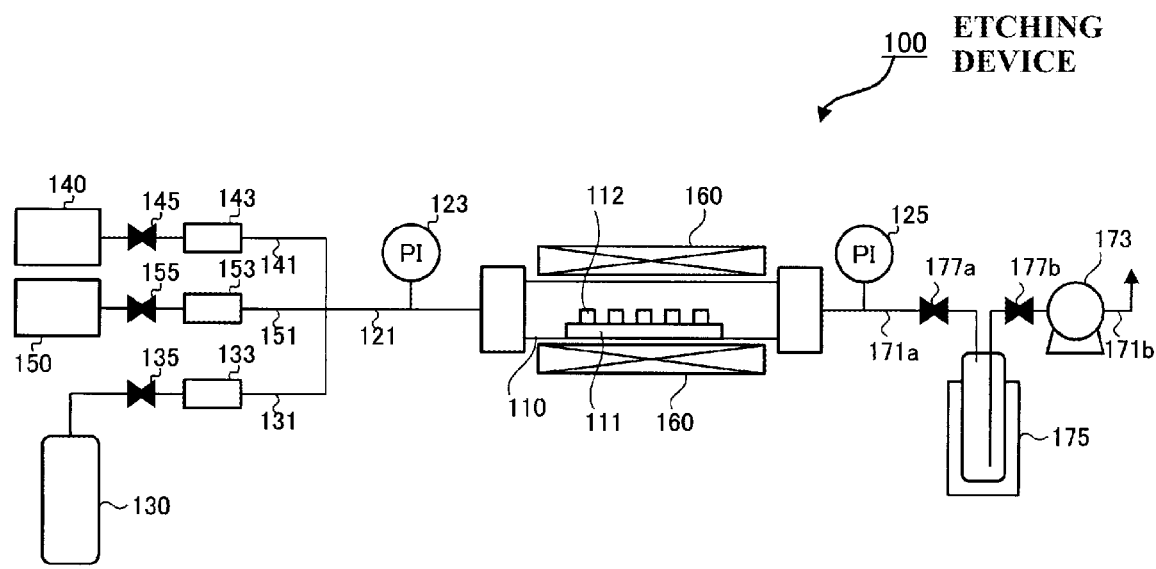
FIG. 1 is a schematic view of an etching device according to one embodiment of the present invention.

Hereinafter, embodiments of the present invention will be described in detail below. It should be understood that: the present invention is not limited to the following embodiments; and various changes and modifications of the following embodiments can be made as appropriate without departing from the scope of the present invention.

(Etching Method of Metal Film)

One embodiment of the present invention is a dry etching method for etching a metal film on a substrate with an etching gas containing a β-diketone and an additive gas, wherein the metal film contains a metal element capable of forming a complex with the β-diketone; and wherein the amount of water contained in the etching gas is 30 mass ppm or less relative to the amount of the β-diketone.

When the etching gas is introduced into an etching device in which the workpiece with the metal film is placed, and then, brought into contact with the metal film of the workpiece under heating, a metal complex is formed by reaction of the β-diketone with the metal element of the metal film. Since the metal complex is high in vapor pressure, the metal film is removed by vaporization of the metal complex. According to the findings of the present inventors, variations in the etching rate of the metal film are suppressed by controlling the amount of water contained in the etching gas relative to the amount of the β-diketone to not exceed 30 mass ppm. Herein, the amount of water contained in the etching gas is measured with a Karl Fischer moisture meter. In the present invention, water in the etching gas may be present in the form of water molecules alone or present in a state of forming a bond or other interaction with another atom or ion or in a state of forming a hydrate with the β-diketone.

In the present invention, the etching rate is determined as the amount of decrease of the thickness of the metal film per unit time (in units of nm/min) based on a difference in weight (i.e. weight change) of the workpiece before and after etching treatment and a specific gravity of the metal film.

The metal film, as the etching target to be processed by the dry etching method in the present invention, contains a metal element capable of forming a complex with the β-diketone as mentioned above. The metal element can be at least one kind of element selected from the group consisting of Co, Fe, Ni, Zn, Hf, V and Cu. The metal film can be a film composed of only one of the above-mentioned elements or can be a film composed of two or more elements including any of the above-mentioned elements. Examples of the metal film are those made of metal compounds, such as NiSi, CoSi, HfSi, NiCo, FeCo, CoPt, MnZn, NiZn, CuZn and FeNi, and oxides thereof. The present invention is particularly effective for etching of the metal film containing Co. In the present invention, the substrate can be a known semiconductor substrate, glass substrate or the like.

In the present invention, both of the β-diketone and the additive gas need to be contained in the etching gas. Preferably, the additive gas is at least one kind of gas selected from the group consisting of NO, $NO_2$, $O_2$, $O_3$ and $H_2O_2$.

Examples of the β-diketone usable in the present invention are hexafluoroacetylacetone, trifluoroacetylacetone and acetylacetone. The β-diketone can be of one kind or of two or more kinds in combination. For high-rate etching, hexafluoroacetylacetone and trifluoroacetylacetone are preferred. The etching rate of the metal film is increased with increase in the concentration of the β-diketone contained in the etching gas. In the case where the vapor pressure of the β-diketone is so low that there is a possibility of liquefaction of the β-diketone in a film forming apparatus, however, it is preferable to adjust the concentration of the β-diketone in the etching gas with the addition of a diluent gas.

From the viewpoint of attaining a sufficient etching rate, the amount of the β-diketone contained in the etching gas is preferably 10 vol % to 90 vol %, more preferably 30 vol % to 60%, relative to the etching gas composition.

Further, the amount of the additive gas contained in the etching gas is preferably 0.01 vol % to 10 vol %, more preferably 0.05 vol % to 8 vol %, still more preferably 0.1 vol % to 5 vol %, relative to the etching gas composition from the viewpoint of attaining a sufficient etching rate.

The etching gas may contain an inert gas such as $N_2$, He, Ar, Ne, Kr or the like in addition to the β-diketone and the first and second additive gases. As long as the etching gas is diluted to an appropriate concentration with the addition of the inert gas, there is no particular limitation on the amount of the inert gas contained in the etching gas. The amount of the inert gas contained in the etching gas is generally 1 vol % to 90 vol %, preferably 10 vol % to 80 vol %, more preferably 30 vol % to 50 vol %, relative to the etching gas composition.

(Dry Etching Device)

The etching method according to the present invention can be embodied in an ordinary etching device for semiconductor manufacturing process as shown in FIG. 1. More specifically, one embodiment of the present invention is an etching device 100 including: a treatment chamber 110 in which the substrate (as a workpiece 112) with the metal film containing a metal element capable of forming a complex with the β-diketone is placed; a β-diketone supply unit 130 connected to the treatment chamber 110 and configured to supply the β-diketone; an additive gas supply unit 140 connected to the treatment chamber 110 and configured to supply the additive gas; a heating unit 160 configured to heat the treatment chamber 110; and a gas flow rate control unit (not shown) configured to output control signals to control valves 135, 145 and 155 to supply the β-diketone and the additive gas to the workpiece 112.

The treatment chamber 110 includes therein a placement stage 111 on which the workpiece 112 is placed. There is no particular limitation on the treatment chamber 110 as long as the treatment chamber 110 is resistant to the β-diketone used and is capable of being evacuated to a predetermined pressure level. In general, an ordinary treatment chamber of a semiconductor etching device can be utilized as the treatment chamber 110. There is also no particular limitation on the pipes 121, 131, 141 and 151 for supply of the etching gas and the other pipes 171a and 171b as long as these pipes are resistant to the β-diketone used. Ordinary pipes can be utilized.

The β-diketone supply unit 130 is connected to the treatment chamber 110. The β-diketone is supplied from the β-diketone supply unit 130 into the treatment chamber 110 through the pipe 121. As shown in FIG. 1, the β-diketone supply unit 130 is equipped with a valve 135 and a flow rate regulator 133 so as to regulate the amount of the β-diketone supplied. The regulated amount of the β-diketone is fed from the pipe 131 to into the pipe 121. Further, the inert gas supply unit 150 is equipped with a valve 155 and a flow rate regulator 153 so as to regulate the amount of the inert gas supplied as the diluent gas. The regulated amount of the inert gas is fed from the pipe 151 into the pipe 121. The additive gas supply unit 140 is equipped with a valve 145 and a flow rate regulator 143 so as to regulate the amount of the additive gas supplied. The regulated amount of the additive gas is fed from the pipe 141 into the pipe 121.

It is preferable in the etching device 100 that the β-diketone is supplied in a state of being diluted to a predetermined concentration with the inert gas supplied from the inert gas supply unit 150 and being mixed at a predetermined concentration with the additive supplied from the additive gas supply unit 140. The β-diketone may however not necessarily be diluted with the inert gas.

The heating unit 160 is disposed externally of the treatment chamber 110 so as to heat the treatment chamber 110. As a second heating unit, a heater (not shown) may be disposed inside the placement stage 111. In the case where the treatment chamber 110 has a plurality of placement stages, heaters may be provided in the respective placement stages so as to individually set the temperatures of the placement stages to predetermined degrees.

A gas discharge unit for discharge of the gas after the reaction is disposed on one side of the treatment chamber 110. The discharge gas unit has a vacuum pump 173 by which the gas after the reaction is discharged from the treatment chamber 110 through the pipe 171a. The gas after the reaction is collected in a liquid nitrogen trap 175 which is disposed between the pipes 171a and 171b. Valves 177a and 177b are disposed between the pipes 171a and 171b so as to regulate the pressure of the gas. In FIG. 1, PI 123 and PI 125 are pressure gauges. Base on the readings of these pressure gauges, the respective flow rate regulators and valves are controlled.

An implementation example of the etching method by the etching device 100 will be now explained below.

The substrate (workpiece 112) with the metal film containing a metal element capable of forming a complex with the β-diketone is placed in position. The insides of the treatment chamber 110, the pipes 121, 131, 141 and 151, the liquid nitrogen trap 175 and the pipes 171a and 171b are evacuated to a predetermined pressure level by the vacuum pump 173. After that, the workpiece 112 is heated by the heating unit 160. When the temperature of the workpiece 112 reaches a predetermined degree, the β-diketone, the additive gas and the diluent gas are respectively supplied at predetermined flow rates from the β-diketone supply unit 130, the additive gas supply unit 140 and the inert gas supply unit 150 into the pipe 121.

The β-diketone is diluted and then mixed at a predetermined composition ratio with the additive gas. The thus-mixed etching gas is supplied into the treatment chamber 110. While introducing the mixed etching gas into the treatment chamber 110, the pressure inside treatment chamber 110 is controlled to a predetermined pressure level. Then, the metal film is subjected to etching treatment by reacting the metal film with the etching gas for a predetermined time. In the present invention, the etching treatment enables plasmaless etching. There is thus no need to excite the etching gas into a plasma during the etching treatment.

After the completion of the etching treatment, the heating operation of the heating unit 160 is stopped so that the workpiece is cooled; and the evacuating operation of the vacuum pump 173 is stopped so that the vacuum inside the treatment chamber and the like is released. As explained above, the metal film is etched by the etching method according to the present invention.

(Etching Conditions)

In the etching method according to the present invention, the etching treatment is performed at any temperature where the complex can be vaporized. In particular, the temperature of the etching target metal film during the etching treatment is preferably in a range of 100° C. to 350° C. There is no particular limitation on the pressure inside the treatment chamber during the etching treatment. The pressure inside the treatment chamber during the etching treatment is generally in a range of 0.1 kPa to 101.3 kPa.

In the case where: the etching target metal film contains cobalt; and the etching gas contains hexafluoroacetylacetone as the β-diketone and nitrogen monoxide as the additive gas, the etching of the metal film by the etching gas at a high temperature of about 300 to 400° C. may result in a problem of carbon film formation by decomposition of the hexafluoroacetylacetone or a problem of damage to the device structure. In view of these problems, it is preferable that the workpiece is heated at a temperature of 150° C. to 250° C., more preferably 200° C. to 250° C., still more preferably 220° C. to 250° C. In the above temperature range, the pressure inside the treatment chamber is preferably set to 20 Torr to 300 Torr (2.67 kPa to 39.9 kPa), more preferably 50 Torr to 250 Torr (6.67 kPa to 33.3 kPa), still more preferably 100 Torr to 200 Torr (13.3 kPa to 26.7 kPa), from the viewpoint of attaining a sufficient etching rate.

There is no particular limitation on the etching time. In view of the efficiency of the semiconductor manufacturing process, the etching time is preferably 60 minutes or less. Herein, the etching time refers to a time elapsed from the introduction of the etching gas into the treatment chamber in which the substrate is placed and subjected to etching treatment until the discharge of the etching gas from the treatment chamber by the vacuum pump etc. for completion of the etching treatment.

(Pretreatment of Workpiece)

Pretreatment may be performed on the workpiece as required. In the case where the etching target metal film contains cobalt, for example, etching rate variations depending on the thickness of the metal film are improved by reducing natural cobalt oxide.

It is feasible to perform the pretreatment by e.g. supplying a reducing gas to the workpiece 112 from a reducing gas supply unit (not shown).

In this reducing gas supply step, the reducing gas supplied can be, but is not limited to, hydrogen gas. Gas of carbon monoxide (CO), formaldehyde (HCHO) or the like can also be used as the reducing gas.

Although the reducing gas such as hydrogen gas can be supplied solely in the reducing gas supply step, it is preferable to dilute the reducing gas with a diluent gas such as nitrogen gas.

It is further preferable that the β-diketone and nitrogen monoxide gas are not supplied in the reducing gas supply step. More specifically, the amount of the β-diketone and nitrogen monoxide gas supplied is preferably less than 0.01 vol %, more preferably less than 0.001 vol %, still more preferably 0 vol %, based on the total amount of the gases supplied in the reducing gas supply step.

There is no particular limitation on the treatment temperature of the reducing gas supply step as long as the treatment temperature is in the range where the natural oxide can be reduced. When the treatment temperature of the reducing gas supply step is low, however, the reduction reaction of the natural oxide does not almost proceed. Although the treatment temperature of the reducing gas supply step can be set high, the treatment temperature of the reducing gas supply step is preferably equal to the treatment temperature of the first mixed gas supply step from the viewpoint of operation of the etching device. It is consequently preferable in the reducing gas supply step that the workpiece is heated to 100° C. to 350° C., more preferably 150° C. to 250° C., still more preferably 200° C. to 250° C.

In the reducing gas supply step, the flow rate of the reducing gas is varied depending on the volume of the treatment chamber. There is no particular limitation on the pressure inside the treatment chamber during the reducing gas supply step. The pressure inside the treatment chamber during the reducing gas supply step is set appropriately within the range of e.g. 10 to 500 Torr (1.33 to 66.5 kPa) according to the device.

The treatment time of the reducing gas supply step can be adjusted as appropriate depending on the film forming method of the metal film on the substrate and the like.

(Filled Container)

Figure 2:
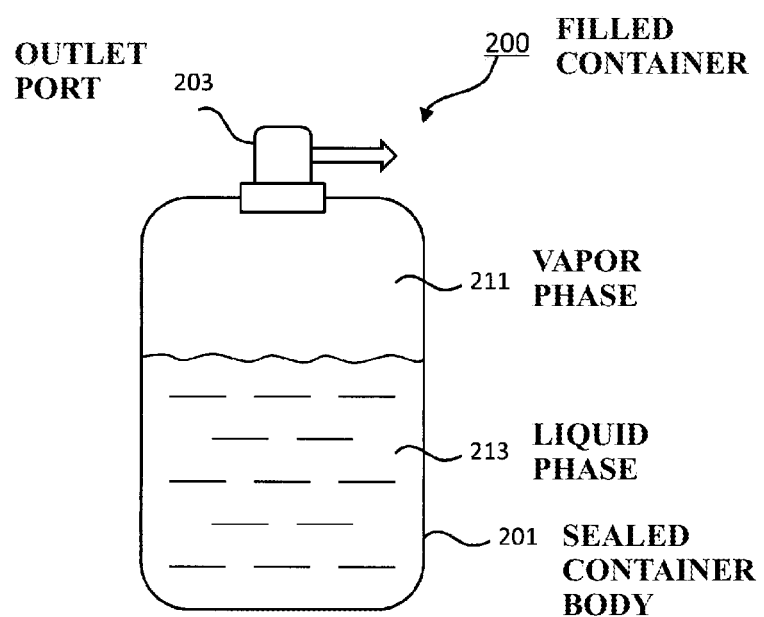
FIG. 2 is a schematic cross-sectional view of a filled container according to one embodiment of the present invention.

In the present invention, the β-diketone supply unit 130 can be a β-diketone filled container 200 having a sealed container body 201 filled with a purified β-diketone as shown in FIG. 2. The β-diketone filled container 200 is obtained by charging the β-diketone in liquid form into the sealed container body 201. In the sealed container body 201, the β-diketone is separated into a liquid phase 213 and a vapor phase 211. An outlet port 203 for charging and discharging of the β-diketone is attached to the sealed container body 201 so that the β-diketone in the vapor phase 211 can be supplied in gaseous form through the outlet port. In the case of supplying the β-diketone in gaseous form from the β-diketone filled container 200, it is necessary to heat the β-diketone filled container 200 and compensate for vaporization heat of the β-diketone in the liquid phase 213.

Due to a difference in vapor pressure between water and the β-diketone, the water content of the vapor phase 211 may be higher than the water content of the liquid β-diketone in the liquid phase 213. This results in a phenomenon that, at the initial stage of supply of the β-diketone in gaseous form from the β-diketone filled container 200, the water content of the β-diketone supplied in gaseous form becomes higher than the water content of the β-diketone filled in liquid form. Thus, the water content of the β-diketone in the sealed container body is preferably 15 mass ppm or less in order to control the amount of water contained in the etching gas relative to the amount of the β-diketone to not exceed 30 mass ppm from the initial stage to the late stage of the supply of the β-diketone. In other words, the water content of the β-diketone supplied in gaseous form is controlled to not exceed 30 mass ppm from the initial stage of the supply of the β-diketone in gaseous form when the water content of the β-diketone filled in liquid form into the sealed container body 201 is 15 mass ppm or less. The water content of the β-diketone filled in liquid form into the sealed container body 201 is preferably 10 mass ppm or less, more preferably 5 mass ppm or less.

The β-diketone content (purity) of the β-diketone filled in liquid form into the sealed container body 201 is generally 99 mass % or higher, preferably 99.5 mass % or higher, more preferably 99.9 mass % or higher.

Herein, the β-diketone content (purity) of the β-diketone in liquid form is measured by gas chromatography; and the water content of the β-diketone in liquid form is measured with a Karl Fischer moisture meter. In the present invention, water in the liquid β-diketone may be present in the form of water molecules alone or present in a state of forming a bond or other interaction with another atom or ion or in a state of forming a hydrate with the β-diketone.

There is no particular limitation on the method for removing the water content from the liquid β-diketone and thereby obtaining the purified β-diketone to be filled into the sealed container body 201. It is feasible to obtain the purified β-diketone by e.g. distilling the β-diketone or bringing the β-diketone into contact with a drying agent. The drying agent can be a liquid drying agent such as concentrated sulfuric acid or a solid drying agent such as zeolite. In terms of labor and cost, it is acceptable that water is mixed in amount of 0.1 mass ppm or more in the β-ketone in liquid form or gas form.

(Semiconductor Device)

The etching method according to the present invention is applicable as an etching method for forming a predetermined pattern on a metal film of a conventional semiconductor device. The semiconductor device can be manufactured at low cost with the use of the metal film etched by the etching method according to the present invention. Examples of such a semiconductor device are solar cells, hard disk drives, dynamic random access memories, phase-change memories, ferroelectric random access memories, magnetoresistive random access memories, resistive random access memories, MEMS and the like.

EXAMPLES

The embodiments of the present invention will be described in more detail below by way of the following examples. It should be understood that the present invention is not limited to the following examples. The etching test of metal films was carried out as follows to examine the relationship between the water content of the liquid β-diketone in the β-diketone filled container, the amount of water contained in the etching gas and the etching rate of the metal film by the etching gas.

A β-diketone filled container was obtained by filling a sealed container body with liquid hexafluoroacetylacetone (HFAc). The hexafluoroacetylacetone used had a purity of 99.9 mass % or higher and a predetermined water content. In this way, there were obtained a plurality of β-diketone filled containers in which the water content of the liquid hexafluoroacetylacetone filled into the sealed container body was varied from container to container due to differences in the conditions of distillation of the hexafluoroacetylacetone.

The etching device used was of the same type as the etching device 100 shown in FIG. 1. As the workpiece 112, a foil of cobalt (with a size of 2 cm×2 cm and a thickness of 0.1 mm) was used. The above-obtained β-diketone filled container was used as the β-diketone supply unit.

The insides of the treatment chamber 110, the pipes 121, 131, 141 and 151, the liquid nitrogen trap 175 and the pipes 171a and 171b were evacuated to a pressure of lower than 10 Pa. The workpiece on the placement stage 111 was heated by the heating unit 170 and the heater inside the placement stage 111. Herein, the weight of the workpiece had previously been measured. Upon confirming that the heating unit 170 and the heater inside the placement stage 111 reached 220° C., the reducing gas supply step was performed as the pretreatment by supplying hydrogen gas at a rate of 10 sccm and a pressure of 50 Torr from a hydrogen gas supply unit for 5 minutes. After the completion of the pretreatment, the insides of the treatment chamber and the like were again evacuated to a pressure of lower than 10 Pa. Then, the hexafluoroacetylacetone in gaseous form, the additive gas and the inert gas were fed at predetermined flow rates into the pipe 121 so as to thereby introduce the etching gas into the treatment chamber 110 while controlling the pressure inside the treatment chamber 110 to a predetermined pressure level. After the lapse of a predetermined time from the initiation of the introduction of the etching gas, the introduction of the etching gas was stopped; and the vacuum inside the treatment chamber was released. The workpiece was taken out from the treatment chamber. The weight of the workpiece was measured. The etching rate of the metal film was determined from the amount of decrease of the thickness of the metal film based on a change in the weight of the workpiece before and after the test operation as well as the etching time.

The purity of the hexafluoroacetylacetone in liquid form and in gaseous form was measured by gas chromatography. The water content of the hexafluoroacetylacetone in liquid form and in gaseous form was measured with a Karl Fischer moisture meter.

In the etching test, the temperature of the workpiece was 220° C.; the total amount of the etching gas introduced was 100 sccm; the additive gas used was NO; the diluent gas used was $N_2$; the pressure inside the treatment chamber was 100 Torr; and the etching time was 2.5 minutes. Assuming that the use rate of the β-diketone filled container was 0% immediately after the filling and 100% when the β-diketone filled container became empty, the content amount of water in the β-diketone in gaseous form and the etching rate of the metal film were determined at various use rates. The water content of NO and $N_2$ supplied was 1 volume ppm or less.

The etching conditions and etching rates of the respective examples and comparative examples are shown in TABLE 1. The relationship between the content amount of water relative to the β-diketone in the etching gas and the etching rate of the metal film by the etching gas is shown in FIG. 3.

Figure 3:
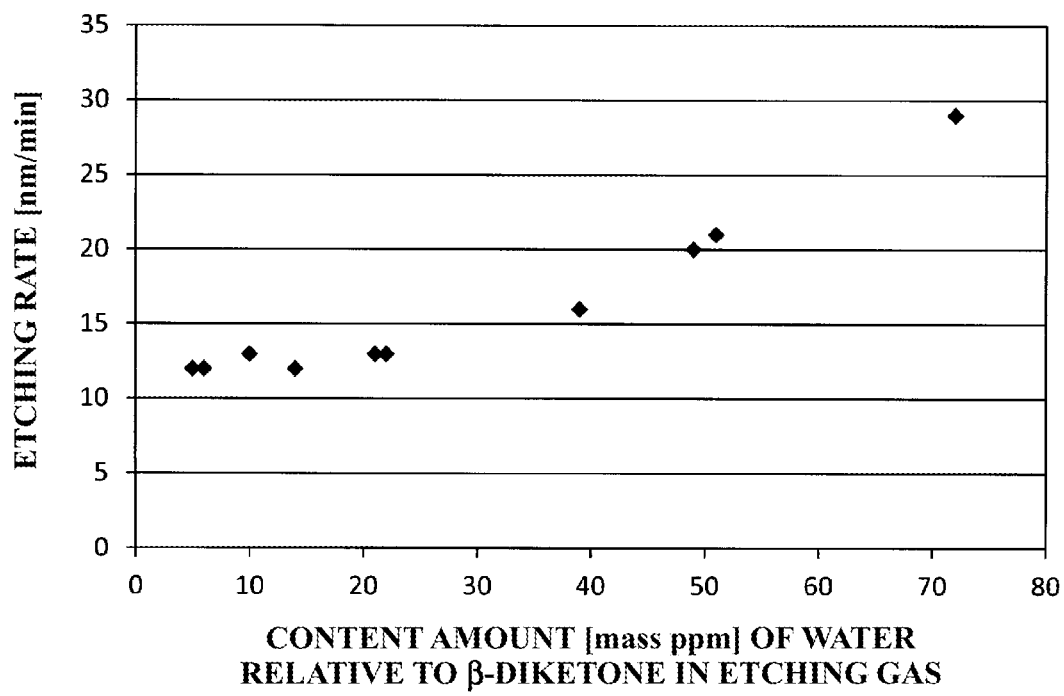
FIG. 3 is a graph showing the relationship between the content amount of water in the etching gas and the rate of etching by the etching gas in Example and Comparative Example.

As is apparent from FIG. 3, the etching rate was stable unless the content amount of water relative to the β-diketone in the etching gas exceeded 30 mass ppm.

Since water ($H_2O$) contained in the etching gas is capable of oxidizing the metal element of the metal film and is capable of being coordinated, together with the β-diketone, on the metal element of the metal film to form a metal complex, the water contained in the etching gas is considered to have the effect of promoting the etching of the metal film. For this reason, it is assumed that variations in the etching rate were suppressed by controlling the amount of water in the β-diketone-containing etching gas to a predetermined value or less.

It is also apparent that the content amount of water in the etching gas at a use rate of 5% was higher than the water content of the β-diketone filled in liquid form.

When the hexafluoroacetylacetone in liquid form with a water content of 15 mass ppm or less was filled into the β-diketone filled container as in Examples 1-1 to 1-4 and 2-1 to 2-4, the water content of the hexafluoroacetylacetone supplied in gaseous form did not exceed 30 mass ppm over the whole range of the use rate from 5% to 60%. The content amount of water relative to the β-diketone in the etching gas did also not exceed 30 mass ppm over this whole range. Thus, the etching rate was stable at a level of 12 to 13 nm/mm.

When the hexafluoroacetylacetone in liquid form with a water content of 42 mass ppm was filled into the β-diketone filled container as in Comparative Examples 1-1 to 1-4, on the other hand, the water content of the hexafluoroacetylacetone supplied in gaseous form exceeded 30 mass ppm over the range of the use rate from 5% to 60%. The content amount of water relative to the β-diketone in the etching gas also exceeded 30 mass ppm. In comparison of Comparative Examples 1-1 and 1-4, the etching rate was 29 nm/min at a use rate of 5% and 13 nm/min at a use rate of 60%. In

TABLE 1

| | | β-Diketone | | | Additive gas | | Diluent gas | | Evaluation results | |
| | | | | | | | | | Content amount [mass ppm] of | Etching |
| | Target metal | Kind | Water content [mass ppm] during filling | Flow rate [sccm] | Kind | Flow rate [sccm] | Kind | Flow rate [sccm] | Use rate | water relative to β-diketone | rate [nm/min] |
|---|---|---|---|---|---|---|---|---|---|---|---|
| Example 1-1 | Co | HFAc | 11 | 50 | NO | 1 | $N_2$ | 49 | 5% | 21 | 13 |
| Example 1-2 | | | | | | | | | 20% | 14 | 12 |
| Example 1-3 | | | | | | | | | 30% | 10 | 13 |
| Example 1-4 | | | | | | | | | 60% | 5 | 12 |
| Example 2-1 | Co | HFAc | 4 | 50 | NO | 1 | $N_2$ | 49 | 5% | 10 | 13 |
| Example 2-2 | | | | | | | | | 20% | 6 | 12 |
| Example 2-3 | | | | | | | | | 30% | 5 | 12 |
| Example 2-4 | | | | | | | | | 60% | 5 | 12 |
| Comparative Example 1-1 | Co | HFAc | 42 | 50 | NO | 1 | $N_2$ | 49 | 5% | 72 | 29 |
| Comparative Example 1-2 | | | | | | | | | 20% | 49 | 20 |
| Comparative Example 1-3 | | | | | | | | | 30% | 39 | 16 |
| Comparative Example 1-4 | | | | | | | | | 60% | 10 | 13 |
| Comparative Example 2-1 | Co | HFAc | 21 | 50 | NO | 1 | $N_2$ | 49 | 5% | 51 | 21 |
| Comparative Example 2-2 | | | | | | | | | 20% | 22 | 13 |
| Comparative Example 2-3 | | | | | | | | | 30% | 14 | 12 |
| Comparative Example 2-4 | | | | | | | | | 60% | 5 | 12 |

Comparative Example 1-1, the etching rate was twice or more higher than in Comparative Example 1-4. The etching rate was thus not stable.

When the hexafluoroacetylacetone in liquid form with a water content of 21 mass ppm was filled into the β-diketone filled container as in Comparative Examples 2-1 to 2-4, the water content of the hexafluoroacetylacetone supplied in gaseous form exceeded 30 mass ppm at a use rate of 5%. The content amount of water relative to the β-diketone in the etching gas also exceeded 30 mass ppm. In comparison of Comparative Examples 2-1 and 2-4, the etching rate was 21 nm/min at a use rate of 5% and 12 nm/min at a use rate of 60%. In Comparative Example 2-1, the etching rate was 1.5 times or more higher than in Comparative Example 2-4. The etching rate was thus not stable.

DESCRIPTION OF REFERENCE NUMERALS

- 100: Etching device
- 110: Treatment chamber
- 111: Placement stage
- 112: Workpiece
- 121: Pipe
- 130: β-Diketone supply unit
- 131: Pipe
- 133: Flow rate regulator
- 135: Valve
- 140: Additive gas supply unit
- 141: Pipe
- 143: Flow rate regulator
- 145: Valve
- 150: Inert gas supply unit
- 151: Pipe
- 153: Flow rate regulator
- 155: Valve
- 160: Heating unit
- 171a, 171b: Pipe
- 173: Vacuum pump
- 175: Liquid nitrogen trap
- 177a, 177b: Valve
- 200: β-Diketone filled container
- 201: Sealed container body
- 203: Outlet port
- 211: Vapor phase
- 213: Liquid phase

The invention claimed is:

1. A dry etching method comprising etching a metal film on a substrate with an etching gas containing a β-diketone and an additive gas,
   wherein the metal film contains at least one kind of metal element selected from the group consisting of Co, Fe, Ni, Zn, Hf, V and Cu β, and is in the form of a film consisting of the metal element or a film consisting of a metal oxide containing the metal element,
   wherein the β-diketone is hexafluoroacetylacetone,
   wherein the additive gas is at least one kind of gas selected from the group consisting of NO, $N_2O$, $O_2$, $O_3$ and $H_2O_2$,
   wherein the amount of water contained in the etching gas is 30 mass ppm or less relative to the amount of the β-diketone,
   wherein the etching is performed by a plasma-less etching process,
   wherein the etching comprises supplying the β-diketone from a β-diketone filled container filled with a purified β-diketone, the purified β-diketone having a purity of 99 mass % or higher and a water content of 4 to 15 mass ppm relative to the β-diketone, and
   wherein the dry etching method further comprises, before the etching, pretreating the metal film on the substrate by supplying at least one kind of reducing gas selected from the group consisting of hydrogen gas, carbon monoxide gas and formaldehyde gas.

2. The dry etching method according to claim 1,
   wherein the etching is performed by bringing the etching gas into contact with the metal film in a temperature range of 100° C. to 350° C.

3. The dry etching method according to claim 1,
   wherein the metal film contains cobalt,
   wherein the etching gas contains nitrogen monoxide as the additive gas, and
   wherein the etching is performed by bringing the etching gas into contact with the metal film in a temperature range of 150° C. to 250° C.

4. The dry etching method according to claim 1,
   wherein the etching gas further contains at least one kind of inert gas selected from the group consisting of $N_2$, Ar, He, Ne and Kr.

5. The dry etching method according to claim 1, wherein the amount of water contained in the etching gas is 0.1 mass ppm or more relative to the amount of the β-diketone.

6. The dry etching method according to claim 1, wherein a flow rate of the reducing gas is controlled such that the pretreating is performed under a pressure of 1.33 to 66.5 kPa.

7. A manufacturing method of a semiconductor device, comprising etching a metal film on a substrate by the dry etching method according to claim 1.

8. A dry etching method for etching a metal film on a substrate, comprising:
   pretreating the metal film on the substrate by supplying a reducing gas;
   after the pretreating, etching the metal with an etching gas containing a β-diketone and an additive gas,
   wherein the metal film contains at least one kind of metal element selected from the group consisting of Co, Fe, Ni, Zn, Hf, V and Cu,
   wherein the reducing gas is hydrogen gas and is supplied such that the pretreating is preformed under a pressure of 1.33 to 66.5 kPa,
   wherein the amount of water contained in the etching gas is 0.1 to 30 mass ppm relative to the amount of the β-diketone,
   wherein the β-diketone is at least one kind of compound selected from the group consisting of hexafluoroacetylacetone, trifluoroacetylacetone and acetylacetone,
   wherein the additive gas is at least one kind of gas selected from the group consisting of NO, $N_2O$, $O_2$, $O_3$ and $H_2O_2$,
   wherein the etching is performed by a plasma-less etching process, and
   wherein the etching comprises supplying the β-diketone from a β-diketone filled container filled with a purified β-diketone, the purified β-diketone having a purity of 99 mass % or higher and a water content of 4 to 15 mass ppm relative to the β-diketone.

* * * * *

UNITED STATES PATENT AND TRADEMARK OFFICE
CERTIFICATE OF CORRECTION

| | | |
|---|---|---|
| PATENT NO. | : 11,335,573 B2 | Page 1 of 1 |
| APPLICATION NO. | : 16/461448 | |
| DATED | : May 17, 2022 | |
| INVENTOR(S) | : Kunihiro Yamauchi, Takashi Masuda and Akifumi Yao | |

It is certified that error appears in the above-identified patent and that said Letters Patent is hereby corrected as shown below:

In the Specification

At Column 4, Lines 1-2 should read as follows:
the additive gas is at least one kind of gas selected from the group consisting of NO, $N_2O$, $O_2$, $O_3$ and $H_2O_2$.

Signed and Sealed this
Eighteenth Day of February, 2025

Coke Morgan Stewart
*Acting Director of the United States Patent and Trademark Office*